(12) United States Patent
Graef et al.

(10) Patent No.: US 6,184,711 B1
(45) Date of Patent: Feb. 6, 2001

(54) LOW IMPACT SIGNAL BUFFERING IN INTEGRATED CIRCUITS

(75) Inventors: Stefan Graef, Milpitas; Oscar M. Siguenza, San Jose, both of CA (US)

(73) Assignee: LSI Logic Corporation, Milpitas, CA (US)

( * ) Notice: Under 35 U.S.C. 154(b), the term of this patent shall be extended for 0 days.

(21) Appl. No.: 09/086,184

(22) Filed: May 28, 1998

(51) Int. Cl.$^7$ .......................... H03K 19/177; H01L 25/00
(52) U.S. Cl. ................. 326/41; 326/47; 326/101
(58) Field of Search ...................... 326/41, 47, 101–103, 326/17; 257/202, 909

(56) References Cited

U.S. PATENT DOCUMENTS

| | | |
|---|---|---|
| 4,859,870 | 8/1989 | Wong et al. . |
| 5,306,867 | * 4/1994 | Dow ..................................... 326/101 |
| 5,341,049 | * 8/1994 | Shimizu et al. ........................ 326/41 |
| 5,504,440 | * 4/1996 | Sasaki .................................... 326/17 |
| 5,539,336 | 7/1996 | Nguyen et al. ......................... 326/83 |
| 5,757,208 | * 5/1998 | Tang ..................................... 326/101 |
| 5,999,016 | * 12/1999 | McClintock et al. .................. 326/41 |

OTHER PUBLICATIONS

LSI Logic—LSI TookKit Solutions Delay Calculations White Paper, Copyright © 1994, 1995 by LSI Logic Corporation, Order Number F22001.A, Oct. 1995 (15 pages).
Breaking the Interconnect Barrier, Frequency Technology, http://www.frequency.com/breaking.html, (6 pages), Jan. 1998.

* cited by examiner

*Primary Examiner*—Jon Santamauro
(74) *Attorney, Agent, or Firm*—Mitchell, Silberberg & Knupp LLP

(57) ABSTRACT

A low impact buffer structure disposed in unused silicon area in a signal line routing channel between logic cell rows of an integrated circuit. In a buffer cell according to the invention, power to the buffer is provided by the power supply rails of one or more nearby logic cell rows. Both the connections to the supply rails and the connections between the transistors of the buffer cell are constructed of a polysilicon material and/or lower metal layer. In this manner, the buffer cell does not significantly impact the routing of metal signal lines in the signal line routing channel. In addition, the buffer cells can be arranged in a "staggered" configuration wherein separate buffers are provided in individual routing tracks of a signal line routing channel, further reducing the possibility of interference with normal signal routing. In addition, layout and routing tools according to the present invention are capable of monitoring the routing or loading of a signal line to determine when it reaches a length or load factor that may give rise to timing problems. When such a signal line is identified, the routing tool routes the signal line to the nearest available buffer cell or causes a buffer cell to be placed in a convenient location, preferably in the current routing channel. Following the routing process, updated netlist and timing information is generated for back-annotation to other design tools.

14 Claims, 5 Drawing Sheets

LOW IMPACT SIGNAL BUFFERING IN INTEGRATED CIRCUITS

BACKGROUND OF THE INVENTION

1. Field of the Invention

The present invention relates to buffer circuitry fabricated on semiconductor dies, and more particularly to buffering circuitry located in the signal line routing regions or channels of integrated circuits.

2. Description of the Related Art

Integrated circuits have become key components of many consumer and commercial electronic products, often replacing discrete components and enhancing product functionality. The semiconductor processing technologies that produce these integrated circuits have advanced to the point where complete systems can now be reduced to a single integrated circuit or application specific integrated circuit (ASIC) device. These integrated circuits (also referred to as "chips") may incorporate many functions that previously could not be implemented together on a single chip, including: microprocessors, digital signal processors, communication circuits, mixed signal and analog functions, large blocks of memory and high speed interfaces. The requisite level of integration, however, significantly complicates the design and manufacturing processes.

One difficult task facing integrated circuit manufacturers involves interconnecting the millions of logic gates and megabytes of memory that may be present on a chip. To aid in this task, new metallization schemes have been developed that allow five or more distinct "levels" or layers of metal interconnect wires, with pitches of 0.5 $\mu$m and tighter on the first few layers. In most multiple layer metallization schemes, the various metal interconnect wires have different nominal widths and heights, different distances from transistor gates, and are insulated by oxide layers of varying thickness.

As semiconductor processes migrate further into the deep sub-micron range with multiple metal layers, increased circuit speeds allow the delay caused by the metal interconnect wires to reach the magnitude of active elements. The performance of sub-micron integrated circuitry can be dominated by propagation delays through the metal interconnect wires rather than the basic gate delays (i.e., transistor delays) of individual logic elements (also referred to as "logic cells" or "cells"). This phenomenon is attributable to a number of factors, including the fact that as the width of a wire shrinks in deep sub-micron designs, the resistance of the wire increases. Further, as transistor features shrink, their drive capability also decreases. It has been estimated that interconnect contributes as much as 70–80% of the total delay in integrated circuits implemented in 0.25 $\mu$m process rules.

The aforementioned delays are manifested by "ramp time" effects. When a logic gate asserts or desserts a signal by applying or removing a voltage at one end of a signal line, the voltage at the input to a logic gate receiving the signal does not change instantaneously. Instead, there is a ramp time delay due principally to signal line impedance and capacitance. The voltage at the other end of the signal line "ramps" to the applied voltage, in a continuous, but not instantaneous, manner. Consequently, when a logic gate in one part of an integrated circuit sends a signal to a logic gate in another part of the integrated circuit, a small but noticeable propagation delay and "ramp" time is realized while the signal travels along a signal line. The propagation delay can be conceptualized as the delay between the time a signal transition is initiated and the time the signal begins ramping to an applied voltage.

An increase in average signal ramp times and propagation delays frequently results in a greater number of critical timing paths (e.g., signal paths in which best or worst case simulated propagation delays may approach the limits required for proper functionality). Many timing problems involve such critical timing paths, which effectively limit clock frequencies. Further, faster input signal ramp times may produce different results at a logic cell's output than slower input signal ramp times. For these reasons, errors due to signal ramp times and/or propagation delays become a greater concern in sub-micron integrated circuit designs.

When performing timing analysis on an integrated circuit design, typical verification and synthesis tools estimate signal timing using floorplan or layout-based delay information supplied via back-annotation. For example, synthesis and floorplanning tools are commonly used to identify critical timing paths, while layout parasitic extraction (LPE) tools in conjunction with proprietary technology libraries are used to estimate the delay each critical path will experience in final layout. In the interest of improving manufacturing yields, functional simulations are often performed using these estimated delay values to verify operability. The terms "floorplan" and "layout" refer to the physical geometry of an integrated circuit or die. A floorplan consists of placed groupings of integrated circuit elements, including logic cells, that are used by signal wire routing tools in placing and functionally interconnecting the elements. A layout includes the completed integrated circuit design and is represented by a layout database containing information for generating the masks used to fabricate integrated circuits.

Within the core logic region of a typical integrated circuit, most of the digital logic cells are located in groupings of cells aligned in rows. These "cell rows" are separated by signal line routing channels in which the metal interconnect lines are disposed. Within each cell row, the individual logic cells are tightly grouped in order to conserve expensive silicon area and reduce the length of the signal lines. Layout tools place related logic gates as closely as practical, but signals must sometimes traverse relatively lengthy signal lines.

To correct resulting timing faults, a system designer can utilize buffering circuitry along failing critical paths to meet timing requirements. The "buffer" cells are logic cells which amplify a weak signal and can reduce ramp time on lengthy signal lines or heavily loaded signal lines. In large integrated circuits requiring many buffer cells, however, total die size is often negatively impacted due to the fact that the buffer cells themselves are included in and increase the size of the cell rows.

SUMMARY OF THE INVENTION

Briefly, the present invention provides a low impact buffer structure disposed in unused silicon area in a signal line routing channel between logic cell rows of an integrated circuit. The buffer structure allows a critical signal line to be buffered without negatively impacting the die size of the integrated circuit.

In one embodiment of a buffer cell according to the invention, power to the buffer is provided by the power supply rails of one or more nearby logic cell rows. Both the connections to the supply rails and the connections between the transistors of the buffer cell are constructed of a polysilicon material and/or lower metal layer. In this manner, the buffer cell does not significantly impact the routing of metal signal lines in the signal line routing channel. In addition, the buffer cells can be arranged in a "staggered" configuration wherein separate buffers are provided in individual routing tracks of a signal line routing channel, further reducing the possibility of interference with normal signal routing. A reduction in die size is realized by the invention due to the fact that buffer circuitry is normally consumes space in the logic cell rows.

Further, layout and routing tools according to the present invention are capable of monitoring the routing or loading of a signal line to determine when it reaches a length or load factor that may give rise to timing problems. When such a signal line is identified, the routing tool routes the signal line to the nearest available buffer cell or causes a buffer cell to be placed in a convenient location, preferably in the current routing channel. Following the routing process, updated netlist and timing information is generated for back-annotation to other design tools.

BRIEF DESCRIPTION OF THE DRAWINGS

A better understanding of the present invention can be obtained with the following detailed description of the preferred embodiment is considered in conjunction with the following drawings, in which.

DETAILED DESCRIPTION OF INVENTION

Figure 1:
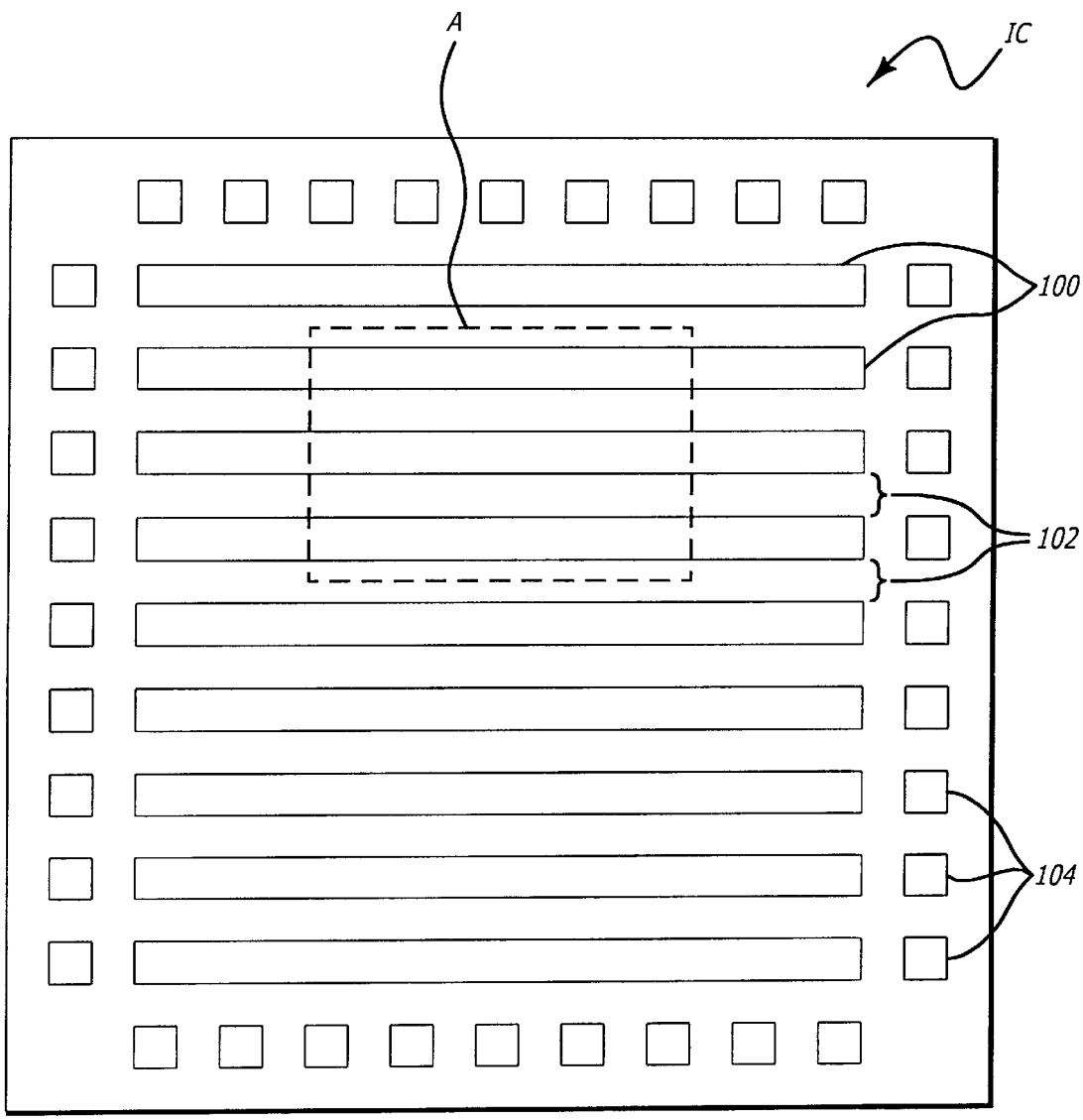
FIG. 1 is a top-level schematic diagram of an integrated circuit according to the present invention.

Referring now to FIG. 1, a top-level schematic diagram of an exemplary integrated circuit IC according to the present invention is shown. The illustrated integrated circuit IC includes a plurality of cell rows 100 in which a large number of logic cells 106 (FIG. 2) are disposed. The cell rows 100 are separated in a typical fashion by signal line routing channels 102. The signal line routing channels 102 are generally packed as densely as possible with metal signal lines which operably interconnect the logic cells 106. Inputs and outputs to the integrated circuit IC are provided by bond pads 104, which are electrically coupled to conductors in an integrated circuit package (not shown). As will be appreciated by those skilled in the art, the logic cell rows 100 can be arranged in a variety of ways. For example, the logic cell rows 100 can be placed as necessary to minimize die size when large blocks of circuitry, such as memory arrays and analog circuitry, are also present on the integrated circuit IC.

Figure 2:
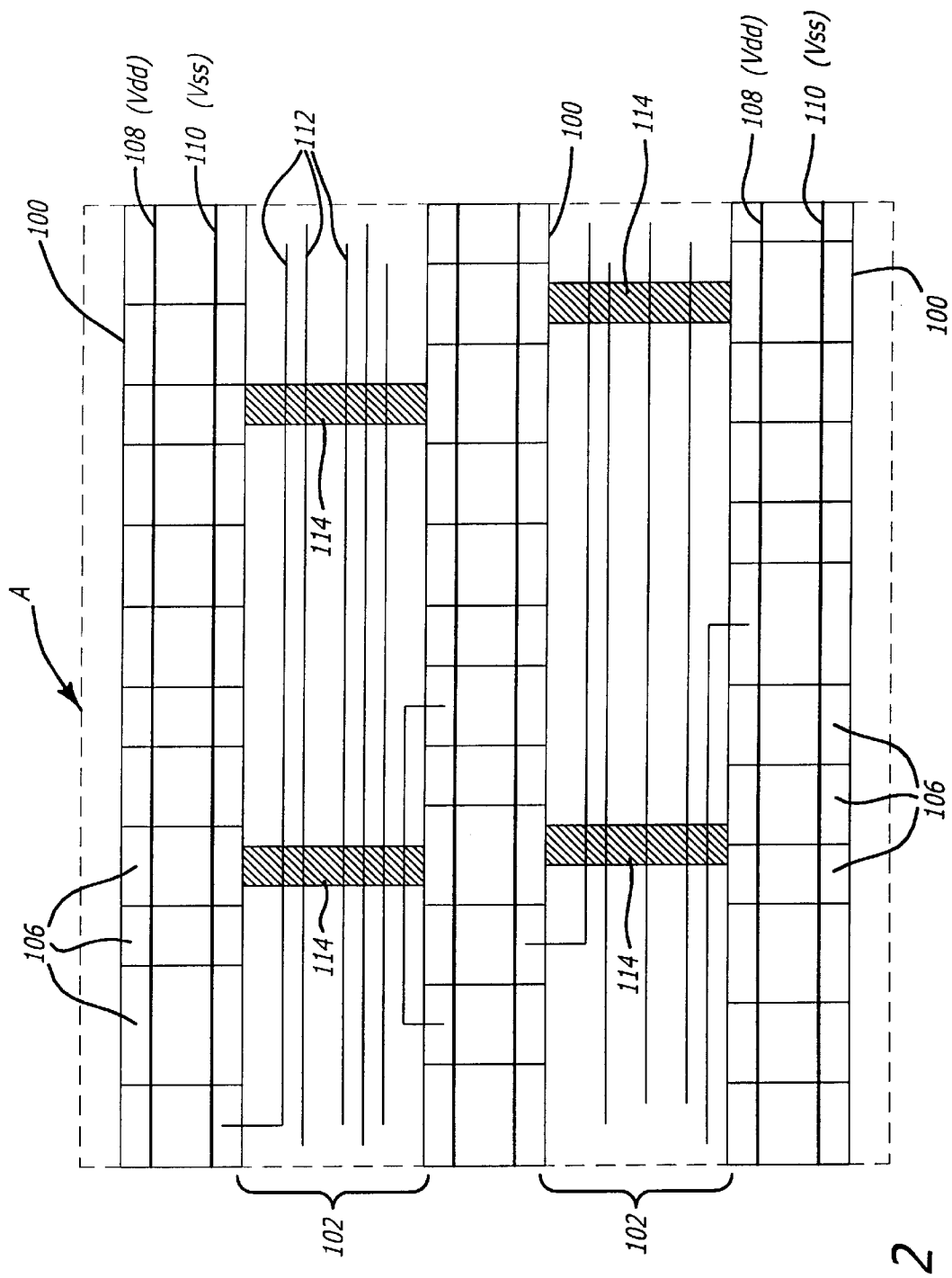
FIG. 2 is a schematic diagram showing portions of the integrated circuit of FIG. 1 in greater detail.

Exemplary details of a section A of the integrated circuit IC are shown in FIG. 2. The signal line routing channels 102 of the integrated circuit IC include several buffer banks or buffer cells 114 according to the present invention. The illustrated buffer banks or buffer cells 114 represent either pre-placed circuitry or areas in the signal line routing channels available for placement of buffer circuitry.

As will be appreciated by those skilled in the art, the precise nature of the logic cells 106 and the signal line 112 interconnects between the logic cells 106 is dictated by the functional design of the integrated circuit IC. Further, many different types of logic cells 106 are typically utilized in the design of an integrated circuit IC.

In the disclosed embodiment of the invention, the logic cells 106 of each of the logic rows 100 receive power from a Vdd power supply rail 108. A Vss or ground rail 110 is also provided to the logic cells 106 of each cell row 100. In a multiple metal layer semiconductor process, the power supply rail 108 and the ground rail 110 are typically formed of a lower layer metal in order to minimize potential interference with signal line 112 routing.

As noted above, the cell rows 100 are separated by signal line routing channels 102. Metallic signal lines 112 are illustrated as predominantly parallel lines located in the signal line routing channels 102. It will be recognized by those skilled in the art that the metallic signal lines 112 can be formed of one or more metal layers in a semiconductor process employing multiple metal layers. The signal lines 112 provide interconnections between the logic cells 106 to allow for the communication of signals. The length of the various signal lines 112, and the corresponding impedance-related effects of the signal lines 112, lead to delays in signals communicated from one logic cell 106 to another logic cell 106. These effects can be modeled to some extent by software design and verification tools, and can be compensated for by placing design rule limits on the lengths of a signal line 112. Historically, however, signal lines often require buffering using buffer cells located in the cell rows 100. While these buffers effectively reduced the effects of ramp time and capacitance-related problems, such a buffering approach tends to increase the size of the logic cell rows 100, thereby increasing the overall size of the integrated circuit IC. According to the invention, signal lines 112 are buffered by employing buffer cells 114 disposed within the signal line routing channels 102, rather than in the cell rows 100.

Figure 3:
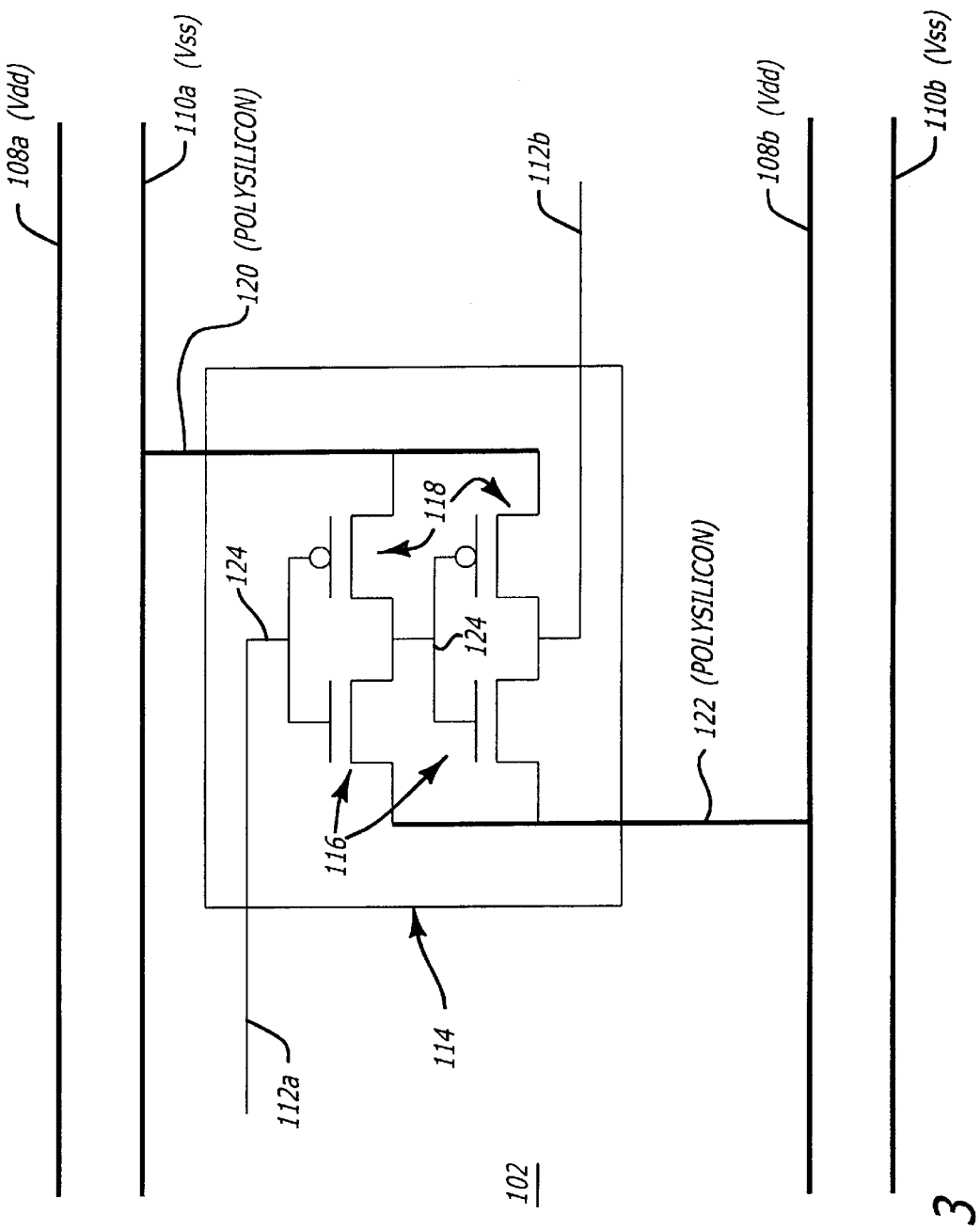
FIG. 3 is a schematic diagram providing details of a buffer circuit according to the present invention.

Referring now to FIG. 3, details of an exemplary buffer cell 114 according to the present invention is shown. One end of a signal line 112a is provided to the input of the buffer cell 114. Signals provided to the buffer cell 114 via the signal line 112a are buffered/amplified by the buffer cell 114 and provided to a second signal line 112b at the output of the buffer cell 114. Internally, the buffer cell 114 is comprised of a number of complimentary metal-oxide semiconductor (CMOS) transistors 116 and 118. The transistors 116 and 118 can be interconnected in a variety of ways to provide the buffering function, with the relative sizes of the transistors 116 and 118 dictating the strengths of the buffer cell 114, as well as the delay associated with the buffer cell 114. Power to the internal transistors 116 and 118 of the buffer cell 114 is provided by electrically conductive connections 120 and 122. More specifically, power to the buffer cell 114 is provided by a connection 122 coupling the buffer cell 114 to the Vdd power supply rail 108b of a first logic cell row 100. Likewise, the ground rail 110a of a second cell row 100 is coupled to the transistors 114 and 116 of the buffer cell 114 by a second connection 120.

Because the buffer cell 114 is implemented in a signal line routing channel 102, it is desirable to keep both the buffer cell 114 and the power and ground connections 122 and 120 as "flat" as possible, meaning that the structures create as few metal signal line 112 blockages. In order to reduce the impact to the routing of the signal lines 112 (which typically utilize all of the metal layers), it may therefore be necessary and desirable to route the power and ground connections 122 and 120 using a polysilicon material. The polysilicon layer is typically formed at an earlier stage in semiconductor processes than the metal layers. Further, it is desirable that the internal interconnections between the transistors 116 and 118 of the buffer cell 114 are similarly routed in a polysilicon material or a first or lower metal layer in a multiple metal layer semiconductor process. By utilizing such materials, metal signal lines 112 formed of upper metal layers can be routed over the buffer cell 114. Such signal lines 112 have been omitted in the figures for sake of clarity.

Figure 4:
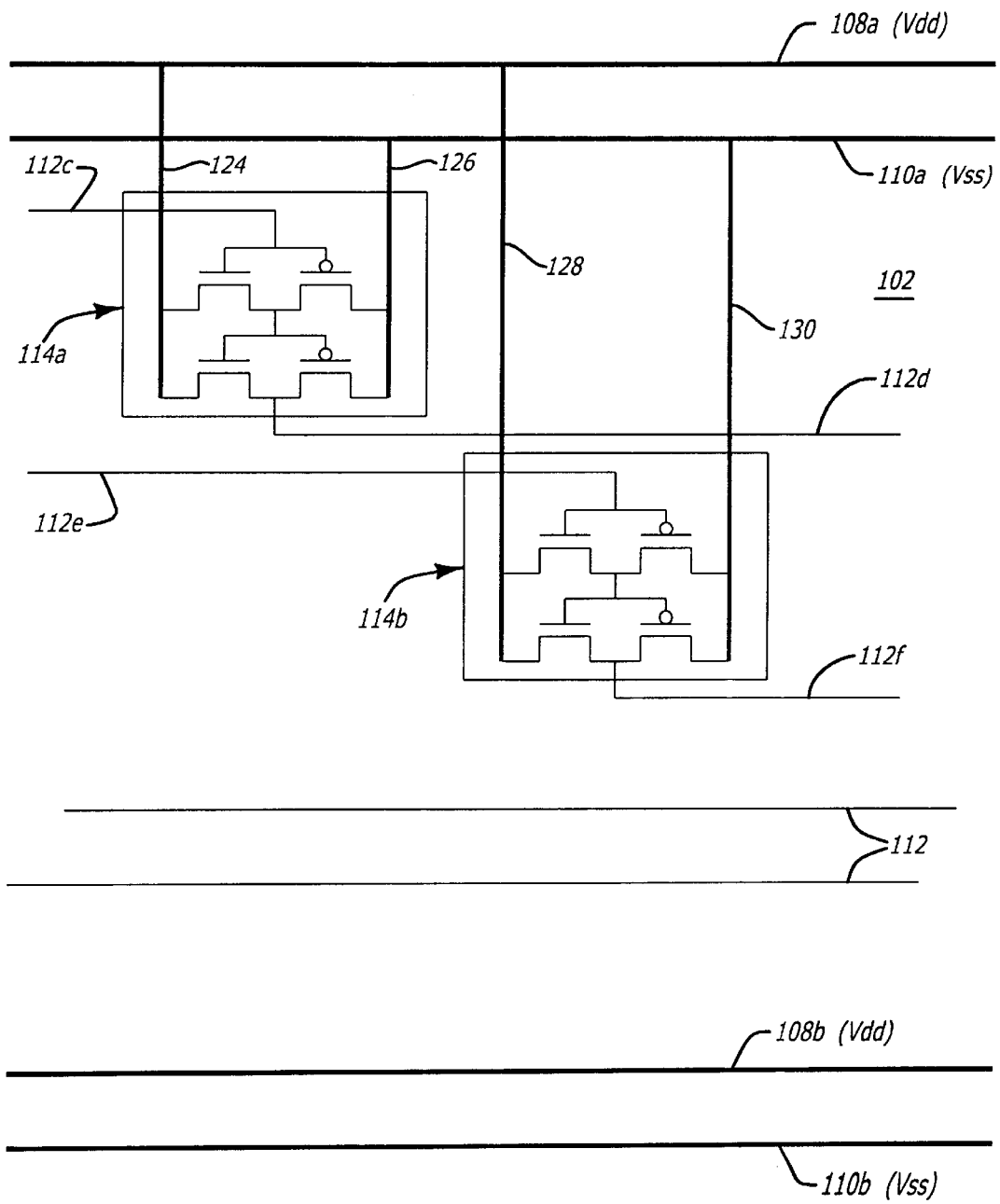
FIG. 4 is a schematic diagram of buffer circuits according to the present invention arranged in a staggered fashion.

Referring now to FIG. 4, a schematic diagram of buffer cells 114 arranged in a staggered fashion according to the present invention is shown. Two separate buffer cells 114a and 114b are illustrated in this alternate embodiment of the invention. Referring first to buffer cell 114a, power is provided by a connection 124 to the Vdd power supply rail 108a of a logic cell row 100. The ground rail 110a of the same logic cell row 100 is also coupled to the transistors of the buffer cell 114a. The input of the buffer cell 114a is coupled to a signal line 112c and drives a signal line 112d.

Power and ground connections to the transistors of the second buffer cell 114b are provided by connections 128 and 130, respectively, to the power supply rail 108a and ground rail 110a of the cell row 100. The input of the buffer cell 114b is coupled to a signal line 112e and drives a signal line 112e.

In the preferred embodiment of the invention, each buffer cell 114 is provided with separate power and ground connections, particularly if the connections are formed of a relatively high resistance polysilicon material. Polysilicon material typically has an ohms per square value which is approximately 100 times higher than that of the metal layer materials. In an embodiment wherein the power and ground connections are formed of polysilicon, providing separate connections for each buffer cell 114 reduces the possibility of resistive voltage drops which may diminish the drive capability of the buffer cell 114. This results in a staggered configuration for the buffer cells 114a and 114b as shown in FIG. 4. In addition, the power and ground connections 124–130 are preferably kept as short as possible.

Further, it may be desirable to only use signal lines 112 with relatively small loading with the embodiments of the buffer cell 114 shown in FIG. 4. Heavily loaded signal lines 112 may require an amount of current of the out of the buffer cell 114 that causes significant resistive drops across the power and ground connections 124–130.

The staggered arrangement of the buffer cells 114a and 114b also reduces the possibility of interference between signal lines 112. Signal line routing channels 102 are sometimes divided into separate routing "tracks" by the routing tools. Each routing track or a portion of each routing track can be utilized for routing separate signal lines 112 on a specific metal layer. Preferably, the buffer cells 114a and 114b, as well as any additional buffer cells 114 (not shown) provided in a signal line routing channel 102, are arranged such that the signal line 112 coupled to the output of one buffer cell 114 does not encroach upon the routing track(s) aligned with the inputs or outputs of other buffer cells 114 in the same signal line routing channel 102.

Figure 5:
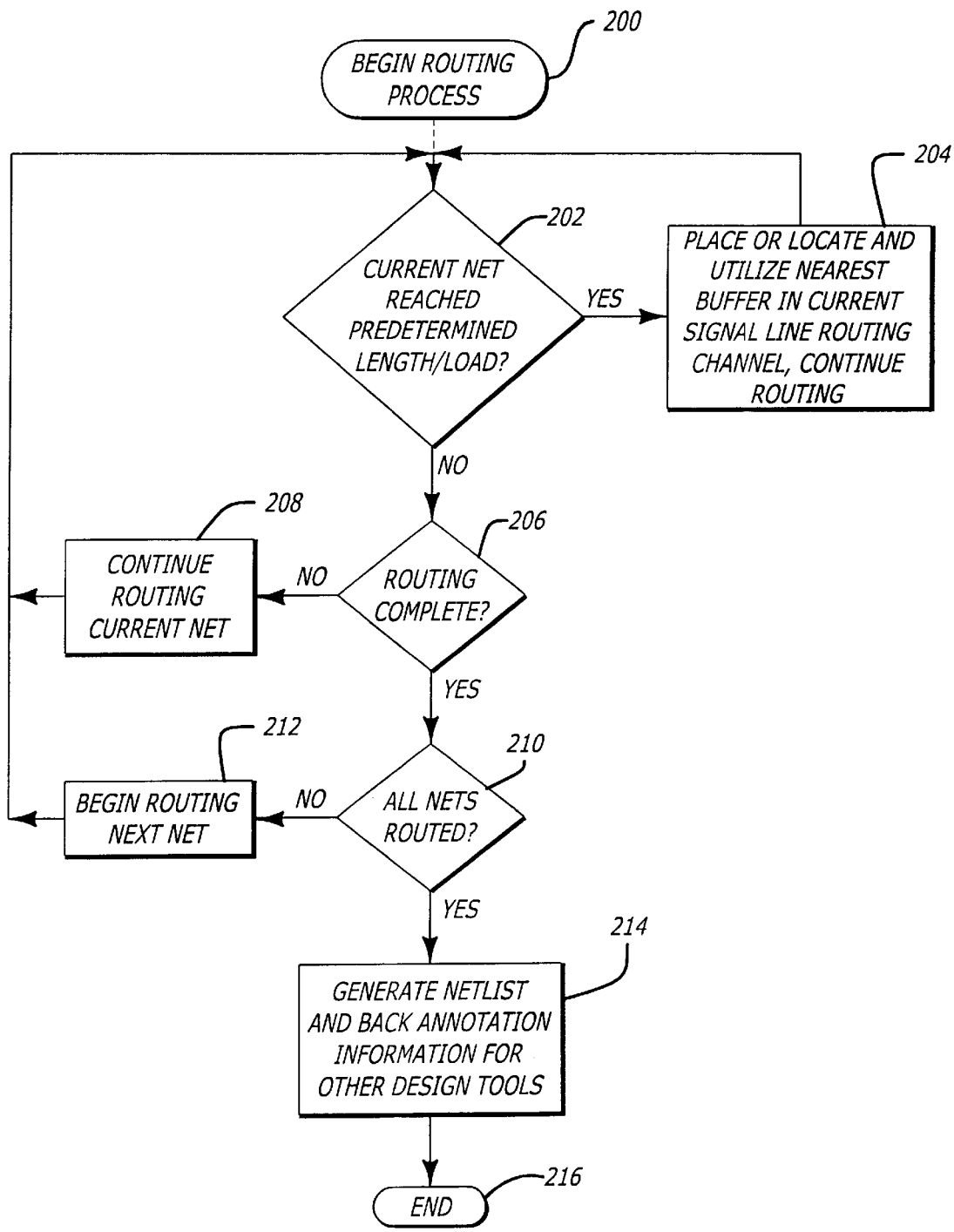
FIG. 5 is a flow chart of a signal routing methodology according to the present invention.

Referring now to FIG. 5, a flow chart of signal routing methodology according to the resent invention is shown. The routing methodology is capable of placing or utilizing buffer cells 114 located in the signal routing channels 102. The signal routing methodology could be implemented in a design flow such as LSI Logic's Flexstream Design Solution, or in any other proprietary or standardized routing methodology.

The disclosed embodiment of the invention commences in step 200 where the routing process begins. Signal line 112 routing typically follows placement of the logic cells 106 in the cell rows 100 in accordance with a layout "netlist." In most integrated circuit design methodologies, a layout netlist and physical design exchange format (PDEF) file are generated for use in the physical design or layout of the integrated circuit IC. The netlist reflects the interconnectivity of the logic elements of an integrated circuit IC, while the PDEF file contains information regarding the physical hierarchy of the logic elements. During the "place and route" procedure, a layout database is generated containing interconnected representations of the individual elements of an integrated circuit IC. A layout database is essentially a complete integrated circuit design and contains information for generating the masks used to fabricate an integrated circuit.

Following various other steps including the routing of a signal line 112, the routing process proceeds to step 202 and the routing tool monitors the signal line 112 (also referred to as a "net" when combined with other signal lines 112) it is currently routing to determine when a predetermined metal layer dependent threshold, such as length or load factor, is reached. When this occurs, the routing tool (in step 204) places or locates the nearest buffer cell 114, preferably in the current signal line routing channel 102. The routing tool then continues routing from the output of the utilized buffer cell 114, and continues to monitor the signal line 112 in step 202.

If the signal line 112 has not reached the predetermined length/load factor as determined in step 202, the routing process continues with step 206 to ascertain if the routing of the current signal line 112 is complete. If not, the routing process continues in step 208. If routing of the current signal line 112 is complete as determined in step 206, the routing process proceeds to step 210 to determine if all signal lines 112 or nets have been routed. If not, the routing tool begins routing the next signal line 112 in step 212. Following either of steps 208 or 212, the routing process returns to step 202 for continued monitoring of the routing of the current signal line 112.

If all nets or signal lines 112 have been routed as determined in step 210, the routing process continues in step 214 where netlist and back-annotation information for other design tools is generated. The routing process is then ended in step 216.

The information generated in step 214 can be utilized by static timing analyzers and delay calculators. Static timing analyzers rely on timing models of all logic cell 106 circuit elements to compare total path delays between the synchronous elements with required signal setup and hold times, thus allowing all delay paths to be checked. Delay calculators may also be used in the static timing analysis process. When delay calculators are used, pre- and post-layout signal delay information is computed and back-annotated into HDL simulators and synthesis tools, and support static timing analysis tools as the basis for these tools internal delay analysis processes. Delay calculators preferably utilize a number of factors, such as pin-to-pin timing data, multiple input ramp times and support for conditional delays. Signal line modeling used in the design and verification processes estimate the effect of wire length and fan out on resistance, capacitance, and area.

Preferably, delay calculators capable of interfacing with all of the CAE tools are utilized in the design flow of the integrated circuit IC. Numerous delay calculators, such as LSIDELAY by LSI Logic Corporation are available for calculating such delays, and can produce files in a format suitable for back-annotation into the synthesis tools. Use of these software verification tools in conjunction with buffer cells 114 according to the invention may decrease development costs incurred by multiple design iterations.

Standardized file formats such as the standard delay format (SDF), the design exchange format (DEF), and the physical design exchange format (PDEF) may be used to pass data between floor planning and the synthesis environment for interconnect delay modeling, although the invention is not limited in scope to use with any particular file formats.

CAE tools according to the present invention are able to account for delays introduced by the buffer cells 114. Any such switching delays, while generally undesirable, may be outweighed by improvements in signal integrity achieved by the reduction of signal ramp time effects accomplished by the buffer cells 114.

Thus, a buffer structure disposed in the unused silicon area in a signal line routing channel between logic cells rows of an integrated circuit has been described. The buffer structure is designed to minimize impact on signal line routing due to metal blockages. Power and ground connections to the internal components of the buffer structure, as well as connections between the transistors of the buffer structure are formed of a polysilicon and/or lower metal layer in order to achieve this result. Layout and routing tools have also been described which are capable of recognizing and utilizing such buffer structures.

The foregoing disclosure and description of the invention are illustrative and explanatory thereof, and various changes in the details of the illustrated apparatus and construction and method of operation may be made without departing from the spirit of the invention.

What is claimed is:

1. An integrated circuit manufactured in a semiconductor process utilizing multiple metal layers to form signal lines for communicating signals between logic gates, comprising:
    plural rows of logic gates;
    signal line routing channels separating the rows of logic gates; and
    buffer circuits disposed in the signal line routing channels for buffering signals communicated between the logic gates,
    wherein each of said buffer circuits has a separate electrical connection, not shared with any other buffer, to each of a power supply rail and a ground rail.

2. The integrated circuit of claim 1, wherein the first row of logic gates include a power supply rail and a ground rail, the buffer circuit being comprised of:
    a plurality of transistors interconnected to amplify an input signal; and electrically conductive connections coupling the plurality of transistors to the power supply rail and the ground rail of the first row of logic gates.

3. The integrated circuit of claim 2, wherein the electrically conductive connections of the buffer circuit are formed of either a polysilicon material or a lower metal layer.

4. The integrated circuit of claim 2, wherein the electrically conductive connections of the buffer circuit are formed of a combination of polysilicon material and a lower metal layer.

5. The integrated circuit of claim 2, wherein the plurality of transistors are interconnected by a polysilicon material.

6. The integrated circuit of claim 2, wherein the plurality of transistors are interconnected by a combination of polysilicon material and a lower metal layer.

7. The integrated circuit of claim 1, wherein the transistors of the buffer circuit are complementary metal-oxide-semiconductor transistors.

8. The integrated circuit of claim 1, wherein the first and second rows of logic gates each include a power supply rail and a ground rail, the buffer circuit being comprised of:
    a plurality of transistors interconnected to amplify an input signal;
    a first electrically conductive connection coupling the plurality of transistors to the power supply rail of the first row of logic gates; and
    a second electrically conductive connection coupling the plurality of transistors to the ground rail of the second row of logic gates.

9. The integrated circuit of claim 8, wherein the first and second electrically conductive connections of the buffer circuit are formed of either a polysilicon material or a lower metal layer.

10. The integrated circuit of claim 8, wherein the first and second electrically conductive connections of the buffer circuit are formed on a combination of a polysilicon material and a lower metal layer.

11. An integrated circuit manufactured in a semiconductor process utilizing multiple metal layers to form signal lines for communicating signals between logic gates, comprising:
    a plurality of rows of logic gates;
    a plurality of signal line routing channels separating the plurality of rows of logic gates;
    a plurality of signal lines disposed in the signal line routing channels for communicating signals between the logic gates; and
    a plurality of buffer circuits disposed in the plurality of signal line routing channels for amplifying signals on signal lines;
    wherein each row of the plurality of rows of logic gates includes a power supply rail and a ground rail, and
    wherein separate electrically conductive connections, not shared with any other buffer, are provided from each of the power supply rail and the ground rail included in an adjacent row of logic gates to each of the plurality of buffer circuits.

12. The integrated circuit of claim 11, wherein each of the plurality of buffer circuits is comprised of:
    a plurality of transistors interconnected to amplify an input signal; and
    electrically conductive connections coupling the plurality of transistors to the power supply rails and the ground rails of the plurality of rows of logic gates.

13. The integrated circuit of claim 12, wherein the electrically conductive connections of the buffer circuits are formed of either a polysilicon material or a lower metal layer.

14. The integrated circuit of claim 12 wherein each of the signal line routing channels is divided into a plurality of routing tracks for placement of signal lines, and wherein adjacent ones of the buffer circuits are disposed in a staggered configuration for receiving signal lines of different routing tracks.

* * * * *